United States Patent [19]

Drake et al.

[11] Patent Number: 4,762,732

[45] Date of Patent: Aug. 9, 1988

[54] PROCESS FOR FORMING SILVER CONDUCTORS ON A SUBSTRATE

[75] Inventors: Allan R. Drake, Brampton; Roger C. Finn, Kanata; Reginald B. P. Bennett, Oakville, all of Canada

[73] Assignee: Northern Telecom Limited, Montreal, Canada

[21] Appl. No.: 101,538

[22] Filed: Sep. 28, 1987

[30] Foreign Application Priority Data

Jul. 6, 1987 [CA] Canada ............................ 541395

[51] Int. Cl.$^4$ ............................................. B05D 3/06
[52] U.S. Cl. .................................... 427/54.1; 427/96
[58] Field of Search ........................ 427/54.1, 96

[56] References Cited

U.S. PATENT DOCUMENTS

| | | | |
|---|---|---|---|
| 3,982,941 | 9/1976 | Inskip | 427/96 |
| 4,049,844 | 9/1977 | Bolon et al. | 427/96 |
| 4,079,156 | 3/1978 | Youtsey et al. | 427/96 |
| 4,404,237 | 9/1983 | Eichelberger et al. | 427/96 |
| 4,666,818 | 5/1987 | Lake et al. | 430/256 |

Primary Examiner—John H. Newsome
Attorney, Agent, or Firm—F. P. Turpin

[57] ABSTRACT

The invention provides a process for forming an electrical conductor pattern on desired areas of a substrate comprising the steps of applying a predetermined pattern of silver polymer ink on the substrate and at least partially curing it. A layer of silver solder paste is then applied over the cured polymer ink to a width larger than that of the ink. The solder paste is then reflowed and allowed to solidify, whereby the silver polymer ink becomes encapsulated in the reflowed silver solder to form the desired pattern of conductors which may then be covered with a layer of dielectric material comprising a cured non-conductive polymer ink.

10 Claims, 1 Drawing Sheet

PROCESS FOR FORMING SILVER CONDUCTORS ON A SUBSTRATE

The invention relates generally to the forming of electrical conductor patterns on a substrate and more particularly to a process for the forming of silver conductors on a substrate.

BACKGROUND OF THE INVENTION

In contemporary electronic apparatus, the components are usually mounted on a substrate and interconnected by conductors printed or otherwise secured to one or both surfaces of the substrate. The interconnecting conductors are fabricated in a wide variety of processes such as, for example, thick-film fired conductor systems, printed circuit boards, and polymer conductors.

In thick-film fired conductors, a mixture of a conducting metal powder, a ceramic or glass binder and an appropriate vehicle is screen printed on a substrate. The conductor pattern on the substrate is then fired at a relatively high temperature, typically between 650° and 900° C. As the temperature rises to the firing temperature, the vehicle is volatilized leaving the metal and binder behind. At the firing temperature, sintering of the metal takes place to a greater or lesser extent with the binder providing adhesion between the metal film formed and the substrate.

The technique used to prepare printed circuit boards can be divided into additive and subtractive technologies. Both procedures require the application of a copper foil over the entire substrate, deposition and removal of a resist, etching of the printed circuit board, drilling holes for component insertion, and in one case, the additional step of electroplating. An advantage of this technology is, however, that the resulting circuit boards can be relatively easily soldered. A further advantage is that plated-through holes can be fabricated to interconnect conductors printed on both sides of the boards as well as provide connection land areas for the conductors on the non-component side of the board. These holes are usually plated with copper and/or tin-lead solder.

The term "polymer conductor" is actually a misnomer since the polymer is not actually a conductor. Instead, the polymer is heavily loaded with a conducting metal and screened on to a substrate. The advantage of this system is that the polymer can be cured by means of radiation (e.g. ultraviolet), catalytically or thermally at temperatures which range from room temperature to about 250° C. As a result of this so called "cold processing", it is possible to use very inexpensive substrates such as films of MYLAR (trademark)—polyethylene terephthalate. The mechanism by which conductivity is achieved is supplied entirely by the finite proximity of individual metallic particles. It has been found that the only metals which can be loaded into the polymer and give acceptable conductivity are the precious metals such as gold and silver. All of the other standard conducting metals tend to oxidize over a period of time and the conductivity between the particles is reduced. Silver has been the predominant choice in polymer conductor systems but the silver systems are generally not solderable because the silver is leached by the lead-tin solder. In addition conductors fabricated using silver polymer ink tend to exhibit characteristics which has made them unusable for printed circuits. Silver migration between closely spread conductors over time creates current leakage problems which may render the circuit useless for its intended use. Silver polymer conductors also exhibit other problems such as dendritic growth, corona degradation, ionic contamination and hydrolytic instability.

It is an object of this invention to provide a process of fabricating printed silver polymer conductors which exhibit greatly improved characteristics over that formed by existing methods.

SUMMARY OF THE INVENTION

In accordance with the invention, there is provided a process for forming an electrical conductor pattern on desired areas of a substrate comprising the steps of applying a predetermined pattern of solderable silver polymer ink on the substrate and at least partially curing it. A layer of silver solder paste is then applied over the cured polymer ink to a width larger than that of the ink. The solder paste is then reflowed and allowed to solidify, whereby the silver polymer ink becomes encapsulated in the reflowed silver solder to form the desired pattern of conductors.

It has been found that the conductors formed by the present process provide substantial improvements over the existing silver polymer ink systems. The aforementioned disadvantages thereof are mostly non-existent and the process lends itself to the formation of conductors on a large variety of substrates including the formation of overlay conductors on both sides of a printed circuit card assembly using known application processes.

BRIEF DESCRIPTION OF THE DRAWINGS

The invention will now be described in conjunction with the drawings in which.

DESCRIPTION OF EXAMPLE EMBODIMENT

Figure 1:
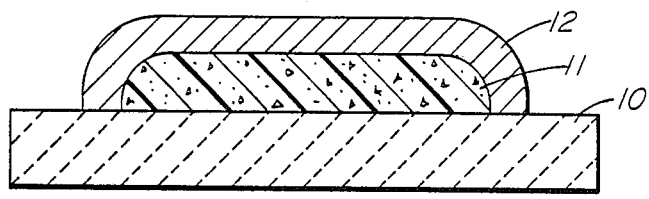
FIG. 1 is a cross-sectional view of a conductor illustrating the steps of the process of the invention.
Figure 2:
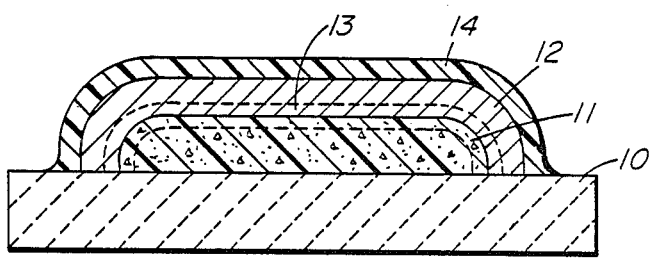
FIG. 2 is a cross-sectional view of a conductor formed by the process of the invention.

The drawing shows a substrate 10 and the cross-section of a conductor comprising a first layer 11 of a solderable silver polymer ink. The choice of silver polymer ink will of course depend on the chosen method of application and the desired conductivity of the conductor. The silver polymer ink is applied to the substrate to form a desired pattern of conductors and is then at least partially cured. It is then covered with a silver solder paste 12 to a width larger than that of the ink. When the silver solder paste is reflowed, it effectively encapsulates the silver ink to provide a conductor exhibiting the advantageous characteristics mentioned above. Since the silver polymer ink and the silver solder paste are compatible materials, the reflowing of the solder paste creates a very strong bond between itself and the silver particles of the ink resulting in an alloyed layer at the interface between the silver polymer ink and the reflowed silver solder shown at 13 in FIG. 2. If the silver polymer ink was only partially cured, the reflow step also completes its curing.

The materials used in the above-described process are generally available as off-the-shelf items. For example, the solderable silver polymer ink may be of the type CBS-2181-HEC available from International Microelectronics Research Corporation of Tucson, Ariz., U.S.A. It comprises a curable polymer and a solvent and contains approximately 80% silver by weight. The silver solder paste may be of the type 62Sn/36Pb/2Ag available from Alpha Metals Incorporated of Jersey City, N.J., U.S.A., and it contains about 2% silver by weight. Very acceptable results may be obtained with a layer of silver polymer ink about 5–10 mils thick and about 10–30 mils wide covered with a layer of silver solder paste about 15–40 mils wide and about 5–10 mils thick. The conductors formed by the above process and with the example materials exhibit a resistivity of approximately 60 milliohms per square per mil of thickness.

The conductors may be isolated from the environment by applying a layer of non-conductive polymer ink 14 over the conductors between their connection points and curing the ink such as by exposure to radiation or to a source of heat. The source of heat for curing both the silver polymer ink and the non-conductive polymer ink may conveniently be a source of infra-red radiation whereas the radiation may be a source of ultraviolet rays. A suitable material for forming this dielectric layer has been found to be of the type MID-8370-CB also available from International Microelectronics Research Corporation.

The conductor pattern may be applied to the surface of a substrate using a variety of well-known application processes such as screen printing, stencilling, transfers and ink dispensers, or a combination of these methods.

Various changes and modifications can be made in the process of this invention without departing from the spirit and scope thereof. The embodiment set forth herein was for the purpose of illustrating the invention and was not intended to limit it.

What is claimed is:

1. A process for forming an electrical conductor pattern on desired areas of a substrate comprising the steps of, applying a predetermined pattern of solderable silver polymer ink on the substrate, at least partially curing the silver polymer ink, applying a layer of silver solder paste over the cured polymer ink to a width larger than that of the ink and causing the silver solder to reflow and solidify, whereby the silver polymer ink is completely cured and becomes encapsulated in the reflowed silver solder to form the desired pattern of conductors.

2. A process as defined in claim 1 comprising the further steps of applying a non-conductive polymer ink over at least a portion of the conductors and curing the non-conductive polymer ink, whereby the portion of the conductors is covered with a dielectric material.

3. A process as defined in claim 2 wherein the silver polymer ink is cured by exposure to a source of heat.

4. A process as defined in claim 3 wherein the non-conductive polymer ink is cured by exposure to a source of heat.

5. A process as defined in claim 3 wherein the source of heat is a source of infra-red radiation.

6. A process as defined in claim 4 wherein the source of heat is a source of infra-red radiation.

7. A process as defined in claim 4 wherein the non-conductive polymer ink is cured by exposure to a source of ultraviolet radiation.

8. A process as defined in claim 1 wherein the silver polymer ink comprises a curable polymer containing a solvent and about 80% by weight of a finely divided silver powder and the silver solder paste contains about 2% silver.

9. A process as defined in claim 8 wherein the layer of silver polymer ink is applied to a width about 10–30 mils and a thickness about 5–10 mils and the layer of silver solder paste is applied to a width of about 15–40 mils and a thickness about 5–10 mils.

10. A process as defined in claim 1 comprising the further steps of applying a non-conductive polymer ink to the surface of the substrate in the areas defining the desired pattern of conductors before applying said predetermined pattern of solderable silver polymer ink and to a width larger than the latter, and at least partially curing the non-conductive polymer ink, whereby the formed pattern of conductors is isolated from the substrate by a layer of dielectric material.

* * * * *